(12) United States Patent
Chang et al.

(10) Patent No.: US 7,898,894 B2
(45) Date of Patent: Mar. 1, 2011

(54) STATIC RANDOM ACCESS MEMORY (SRAM) CELLS

(75) Inventors: Leland Chang, New York, NY (US); Rajiv V. Joshi, Yorktown Heights, NY (US); Stephen V. Kosonocky, Wilton, CT (US)

(73) Assignee: International Business Machines Corporation, Armonk, NY (US)

( * ) Notice: Subject to any disclaimer, the term of this patent is extended or adjusted under 35 U.S.C. 154(b) by 155 days.

(21) Appl. No.: 11/402,401

(22) Filed: Apr. 12, 2006

(65) Prior Publication Data

US 2007/0242513 A1    Oct. 18, 2007

(51) Int. Cl.
   *G11C 11/41*   (2006.01)
   *G11C 8/16*    (2006.01)
   *G11C 5/06*    (2006.01)

(52) U.S. Cl. .............. 365/230.05; 365/154; 365/63; 365/72

(58) Field of Classification Search ........... 365/154, 365/188, 230.05, 63, 72
   See application file for complete search history.

(56) References Cited

U.S. PATENT DOCUMENTS

| 4,935,896 | A | | 6/1990 | Matsumura et al. |
| 5,065,363 | A | * | 11/1991 | Sato et al. ................. 365/154 |
| 5,590,087 | A | * | 12/1996 | Chung et al. ............. 365/230.05 |
| 5,642,325 | A | * | 6/1997 | Ang ....................... 365/230.05 |
| 6,078,544 | A | * | 6/2000 | Park ....................... 365/230.05 |
| 6,347,062 | B2 | * | 2/2002 | Nii et al. ................. 365/230.05 |
| 6,661,733 | B1 | * | 12/2003 | Pan et al. ................. 365/230.05 |
| 6,888,202 | B2 | * | 5/2005 | Kang et al. ................... 257/391 |
| 7,009,871 | B1 | * | 3/2006 | Kawasumi ................... 365/154 |
| 7,102,915 | B2 | * | 9/2006 | Sohn ......................... 365/154 |

* cited by examiner

*Primary Examiner* — J. H. Hur
(74) *Attorney, Agent, or Firm* — Brian Verminski Hoffman Warnick LLC

(57) ABSTRACT

The present invention provides an improved SRAM cell. Specifically, the present invention provides an SRAM cell having one or more sets of stacked transistors for isolating the cell during a read operation. Depending on the embodiment, the SRAM cell of the present invention can have eight or ten transistors. Regardless, the SRAM cell of the present invention typically includes separate/decoupled write word and read word lines, a pair of cross-coupled inverters, and a complimentary pair of pass transistors that are coupled to the write word line. Each set of stacked transistors implemented within the SRAM cell has a transistor that is coupled to a bit line as well as the read word line.

5 Claims, 8 Drawing Sheets

STATIC RANDOM ACCESS MEMORY (SRAM) CELLS

BACKGROUND OF THE INVENTION

1. Field of the Invention

In general, the present invention provides Static Random Access Memory (SRAM) cells. Specifically, the present invention provides eight (8T) and ten (10T) transistor SRAMs that isolate read and write paths through the cell.

2. Related Art

Current 6T SRAM cells suffer from read operation instability caused by random mismatch in threshold voltages (Vts) between adjacent devices. A dopant implant is often used to set the activation threshold of a Metal-Oxide Semiconductor (MOS) transistor. The total amount of dopant implant is a function of the area under the gate of an MOS transistor. As technology scales down, the area under the gate of the MOS transistor is reduced so much that the number of dopant atoms becomes a statistically significant variable, and can cause large random mismatches in activation threshold voltages of neighboring devices. FIG. 1 shows a conventional 6T SRAM cell 10. During a read operation of a conventional SRAM cell 10, the bit line BL and the bit line complement BLN are initially pre-charged to VDD and then set into a high impendence state. The write line WL is then activated and the pass transistors N3 and N4 are turned on to sense the state of the storage nodes S1 and S2, which act to discharge either bit line BL or BLN depending on the stored state. If storage node S1 is at a low state and N1 has a abnormally high VT caused by random dopant implant fluctuation, and N3 has a low VT also caused by a random dopant implant fluctuation, the charge on the bit line BL could cause node S1 to rise high enough to flip the state of S2 before it is sensed. This will cause the circuit to fail and lose its proper state. Other combinations of threshold voltage mismatch and operating point mismatch can cause similar read mode failures in a conventional SRAM cell. A problem with the conventional cell 10 is that during a read operation, the storage nodes S1 and S2 are directly coupled to the bit lines BL and BLN, and thus are susceptible to charge sharing effects. For the conventional 6T SRAM cell 10, allowing longer read times would not help correct the stability problem since the bit has already failed and has lost any stored data.

Another common problem of 6T SRAM cell 10 is the "false" read during write operations that can be exhibited. This is demonstrated in the graph 12 of FIG. 2. Among other things, graph 12 demonstrates the effects when a write signal arrives later than a word line. In addition, a large number of cells on bit lines can lead to read instability. The optimization of pass gate device parameters for the conventional 6T SRAM cell 10 of FIG. 1 is always a fine balance between performance and the stability as the read/write is done through the pass gate. As a result, minimum voltage (Vmin) of the 6T SRAM cell 10 may be limited. Still yet, read or write operations can be done in only one cycle.

In view of the foregoing, there exists a need to solve at least one of the deficiencies of the existing art.

SUMMARY OF THE INVENTION

In general, the present invention provides an improved SRAM cell. Specifically, the present invention provides an SRAM cell having one or more sets of stacked transistors for isolating the cell during a read operation. Depending on the embodiment, the SRAM cell of the present invention can have eight or ten transistors. Regardless, the SRAM cell of the present invention typically includes separate/decoupled write word and read word lines, a pair of cross-coupled inverters, and a complimentary pair of pass transistors that are coupled to the write word line. Each set of stacked transistors implemented within the SRAM cell has a transistor that is coupled to a bit line as well as the read word line.

A first aspect of the present invention provides a Static Random Access Memory (SRAM) cell, comprising: a write word line; a read word line that is decoupled from the write word line; a pair of cross-coupled inverters; a pair of complimentary pass transistors coupled to the write word line; a first set of stacked transistors having a transistor that is coupled to a first bit line and the read word line; and a second set of stacked transistors having a transistor that is coupled to a second bit line and the read word line.

A second aspect of the present invention provides a Static Random Access Memory (SRAM) cell, comprising: a write word line; a first read word line and a second read word line that are decoupled from the write word line; a pair of cross-coupled inverters; a pair of complimentary pass transistors coupled to the write word line; a first set of stacked transistors having a transistor that is coupled to a first bit line and the first read word line; and a second set of stacked transistors having a transistor that is coupled to a second bit line and the second read word line.

A third aspect of the present invention provides a Static Random Access Memory (SRAM) cell, comprising: a write word line; a read word line that is decoupled from the write word line; a pair of cross-coupled inverters; a pair of complimentary pass transistors coupled to the write word line; and a set of stacked transistors having a first transistor that is coupled to a first bit line and the read word line, and a second transistor that is coupled to an input of one of the cross-coupled inverters.

A fourth aspect of the present invention provides a Static Random Access Memory (SRAM) cell, comprising: a write word line; a first read word line and a second read word line that are decoupled from the write word line; a pair of cross-coupled inverters; a pair of complimentary pass transistors coupled to the write word line; and at least one set of stacked transistors having a transistor that is coupled to a bit line and the first read word line.

Therefore, the present invention provides a 8T and 10T SRAM cells having stacked transistors.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, the present invention provides an improved SRAM cell. Specifically, the present invention provides an SRAM cell having one or more sets of stacked transistors for isolating the cell during a read operation. Depending on the embodiment, the SRAM cell of the present invention can have eight or ten transistors. Regardless, the SRAM cell of the present invention typically includes separate/decoupled write word and read word lines, a pair of cross-coupled inverters, and a complimentary pair of pass transistors that are coupled to the write word line. Each set of stacked transistors implemented within the SRAM cell has a transistor that is coupled to a bit line as well as the read word line.

Figure 1:
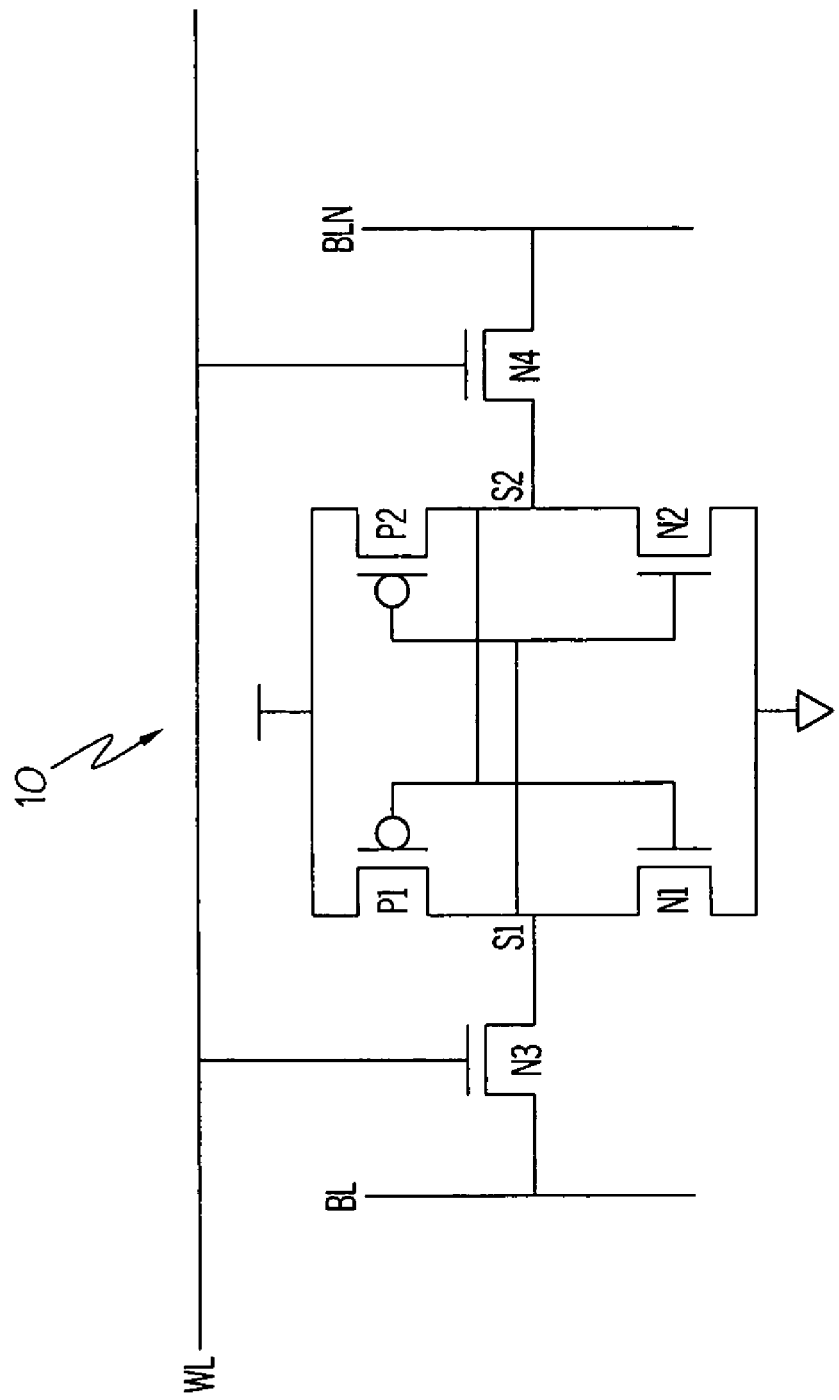
FIG. 1 depicts a 6T SRAM cell according to the prior art.
Figure 2:
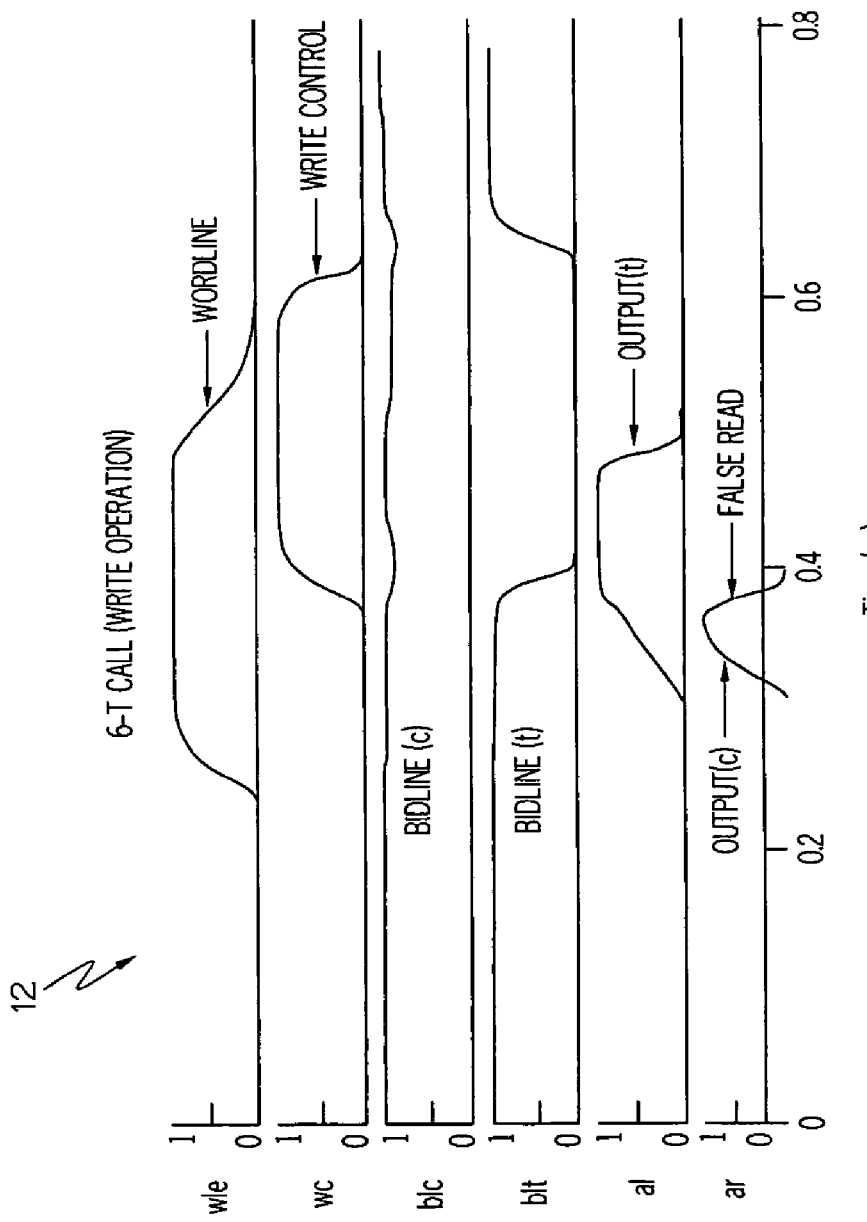
FIG. 2 depicts a graph of a write operation for the 6T cell of FIG. 1.
Figure 3A:
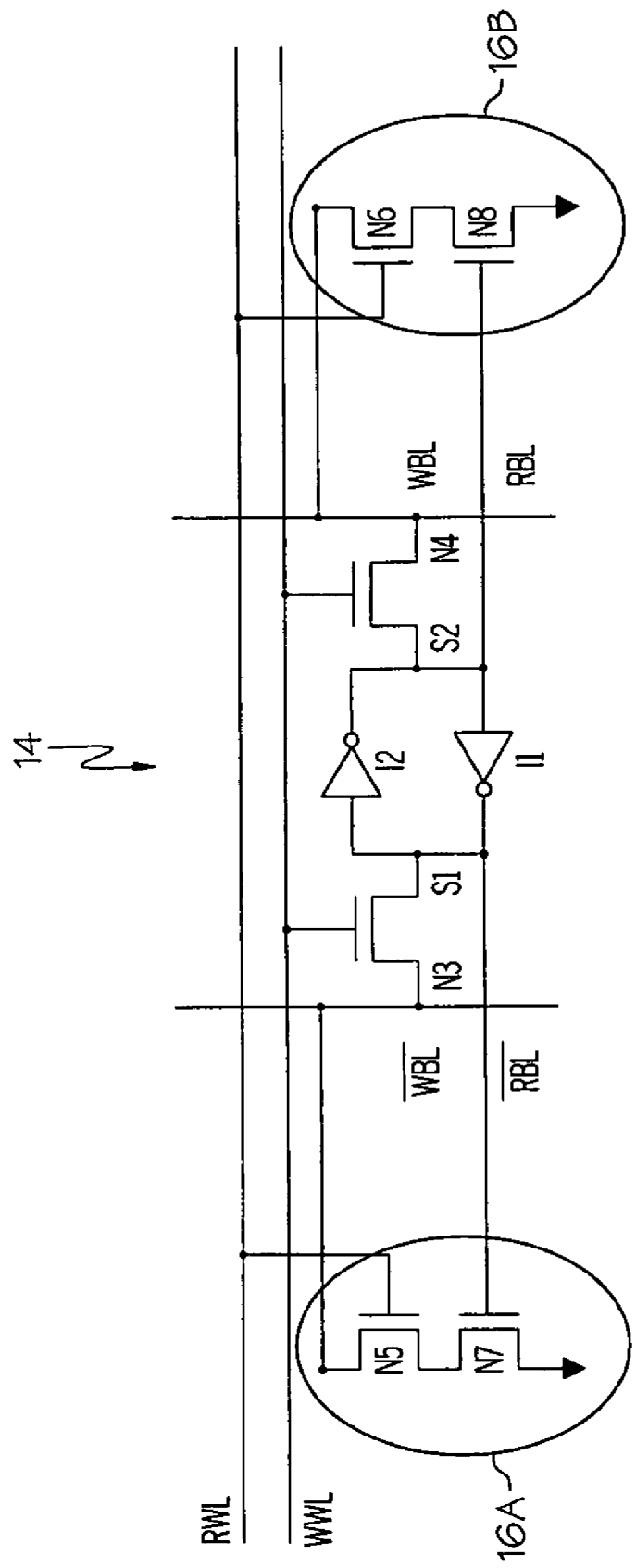
FIG. 3A depicts a symmetrical 10T SRAM cell in accordance with the present invention.

Referring now to FIG. 3A, a symmetrical 10T SRAM cell 14 according to the present invention is shown. As depicted, SRAM cell 14 includes a read word line (RWL), a write word line (WWL) that is decoupled from RWL, cross-coupled inverters I1 and I2 (e.g., having two transistors each), storage nodes S1 and S2, pass transistors N3 and N4, write bit lines (WBLs), and read bit lines (RBLs). Under the present invention, SRAM cell 14 also includes two sets of stacked transistors 16A-B. Specifically, a first set of stacked transistors 16A includes transistors N5 and N7, while a second set of stacked transistors 16B includes transistors N6 and N8. As shown, transistors N5 and N6 are coupled to a RWL and WBL, while transistors N7 and N8 are coupled to a RBL. The use of sets of stacked transistors 16A-B allows the paths through SRAM cell 14 to be isolated (e.g., during a read operation). In this topology, read and write operations share the same bit line to save the wiring channels and improve the area. Reading and writing are done in alternate cycles through the same bit lines. This particular design is compatible with the differential sense-amp design. As a result, the peripheral circuits can remain similar to that of a conventional 6T SRAM cell 10 (FIG. 1).

Figure 3B:
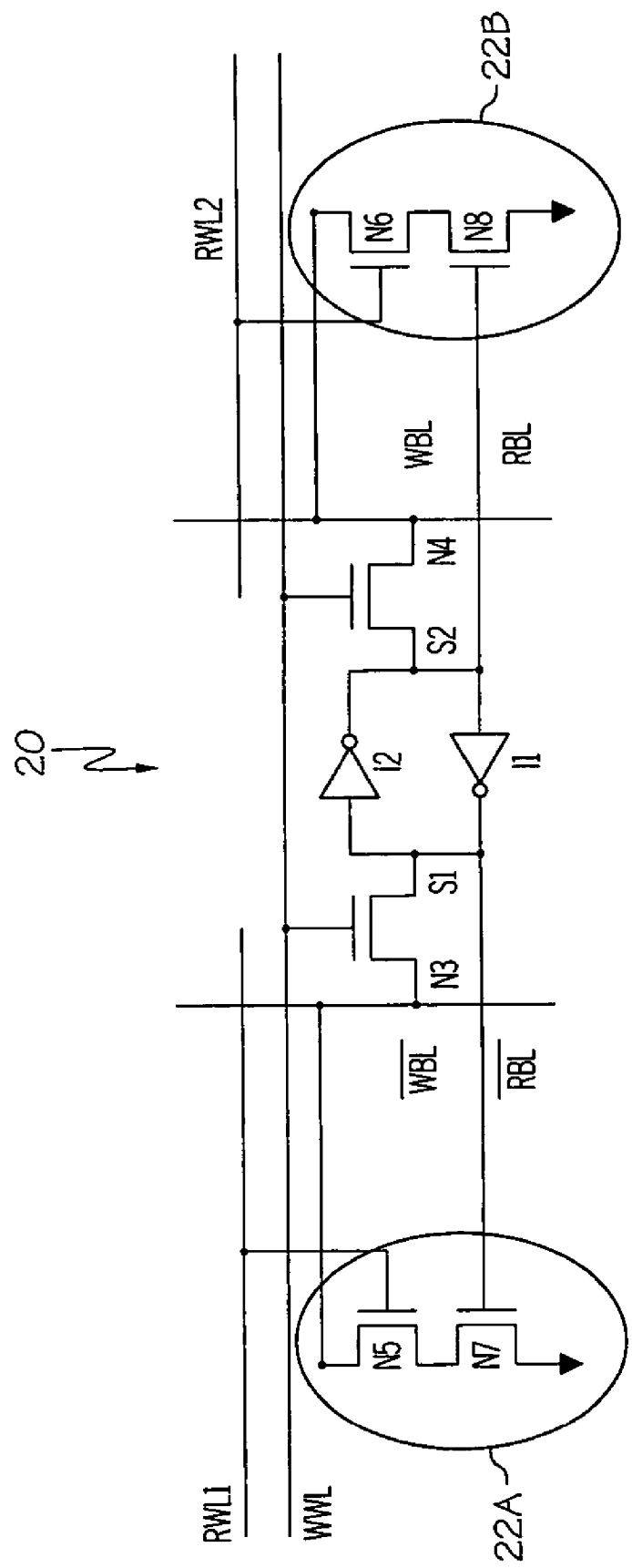
FIG. 3B depicts a dual port and single ended 10T SRAM cell in accordance with the present invention.

Referring to FIG. 3B, a dual port, single ended 10T SRAM cell 20 according to the present invention is shown. As depicted, SRAM cell 20 includes two read word lines (RWL1 and RWL2), a single write word line (WWL) that is decoupled from both RWL1 and RWL2, cross-coupled inverters I1 and I2, storage nodes S1 and S2, pass transistors N3 and N4, write bit lines (WBLs), and read bit lines (RBLs). Similar to FIG. 3A, SRAM cell 20 also includes two sets of stacked transistors 22A-B. Specifically a first set of stacked transistors 22A includes transistors N5 and N7, while a second set of stacked transistors 22B includes transistors N6 and N8. As shown, transistors N5 and N6 are coupled to RWL1 and RWL2, respectively, as well as a WBL. In addition, transistors N7 and N8 are coupled to an RBL. Similar to FIG. 3A, the use of sets of stacked transistors 22A-B allows the paths through SRAM cell 20 to be isolated (e.g., during a read operation).

Figure 3C:
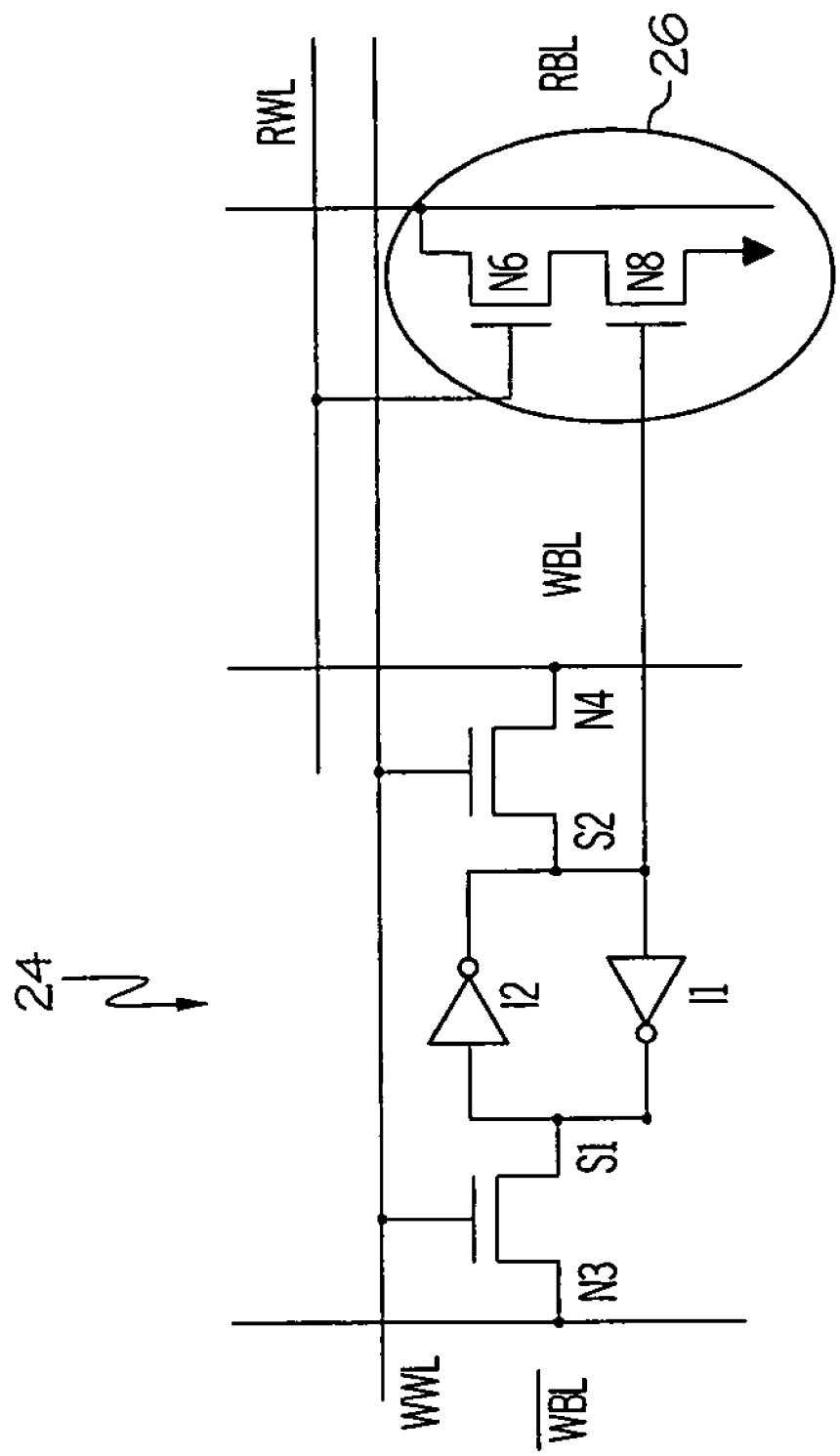
FIG. 3C depicts a single ended 8T SRAM cell in accordance with the present invention.

Referring to FIG. 3C, a single ended 8T SRAM cell 24 according to the present invention is shown. As depicted, SRAM cell 24 includes a read word line (RWL), a write word line (WWL) that is decoupled from RWL, cross-coupled inverters I1 and I2, storage nodes S1 and S2, pass transistors N3 and N4, write bit lines (WBLs), and a read bit line (RBL). Contrary to SRAM cells 14 and 20, SRAM cell 24 includes one set of stacked transistors 26. Specifically, set of stacked transistors 26 includes transistors N6 and N8. As shown, transistor N6 is coupled to RWL, as well as RBL. In addition, transistor N8 is coupled to a WBL. Similar to FIGS. 3A-B, the use of set of stacked transistors 26 allows the paths through SRAM cell 24 to be isolated (e.g., during a read operation). FIG. 3C shows extra bit lines (not sharing the same bit line for read and write operations), in which read and write events could be performed in a same cycle using the same or different cells of an array.

Figure 3D:
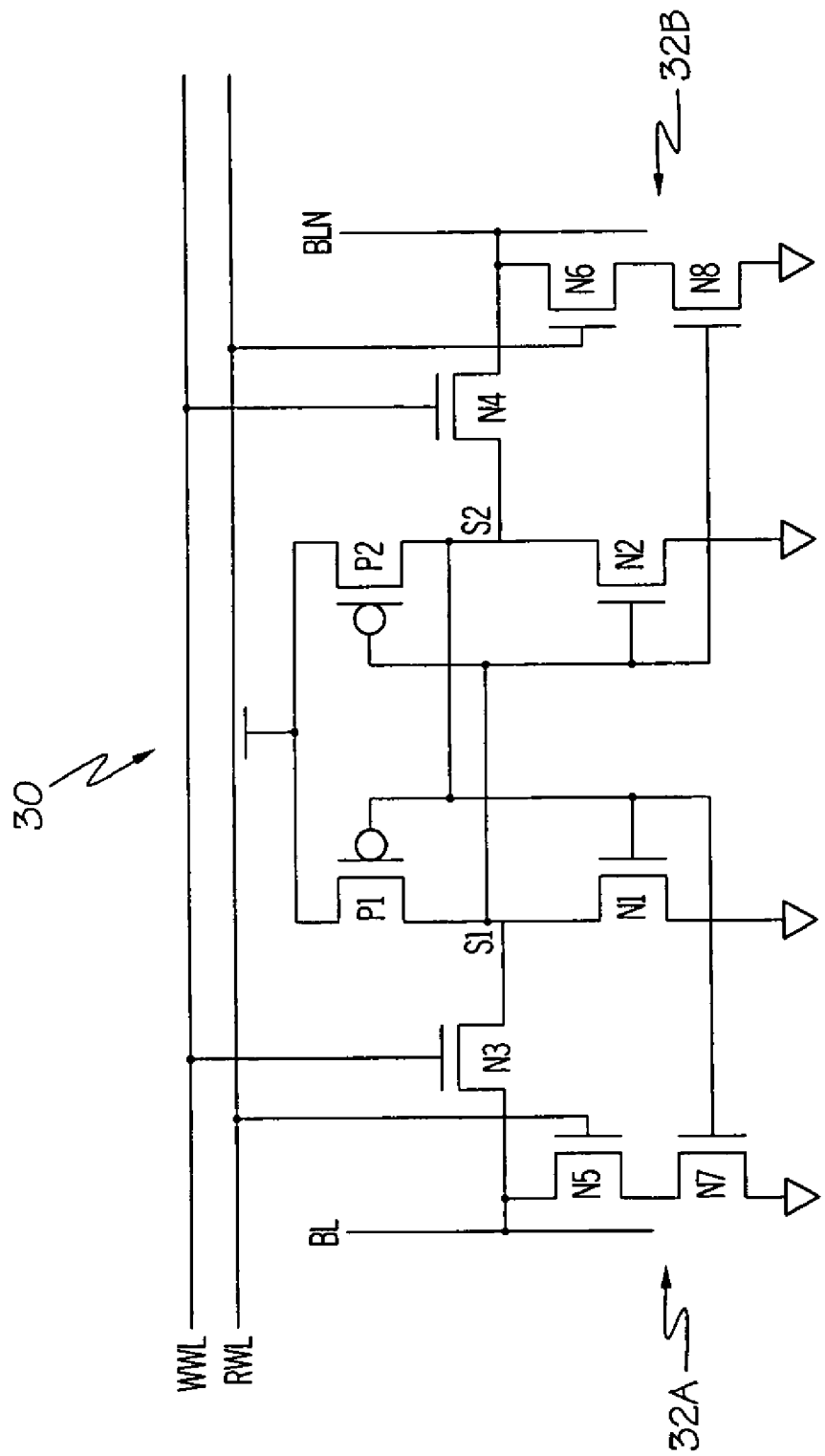
FIG. 3D depicts a symmetrical 10T SRAM in accordance with the present invention.

Referring now to FIG. 3D, a symmetrical 10T SRAM cell 30 according to the present invention is shown. As depicted, SRAM cell 30 includes a read word line (RWL), a write word line (WWL) that is decoupled from RWL, and transistors P1, P2, N1 and N2. It should be understood that transistors P1, P2, N1 and N2 can be embodied as/referred to as a pair of cross-coupled inverters similar to FIGS. 3A-C. In such a case, P1 and N1 would comprise one inverter, while P2 and N2 would comprise another inverter. In any event, SRAM cell 30 also includes storage nodes S1 and S2, pass transistors N3 and N4 coupled to WWL, and complimentary bit lines BL and BLN. Under the present invention, SRAM cell 30 also includes two sets of stacked transistors 32A-B. Specifically, a first set of stacked transistors 32A includes transistors N5 and N7, while a second set of stacked transistors 32B includes transistors N6 and N8. As shown, transistors N5 is coupled to BL and RWL, and transistor N6 is coupled to BLN and RWL. Furthermore, transistor N7 is coupled to storage node S2, while transistor N8 is coupled to storage node S1. As indicated above, the use of sets of stacked transistors 32A-B allows the paths through SRAM cell 30 to be isolated (e.g., during a read operation).

Figure 4A:
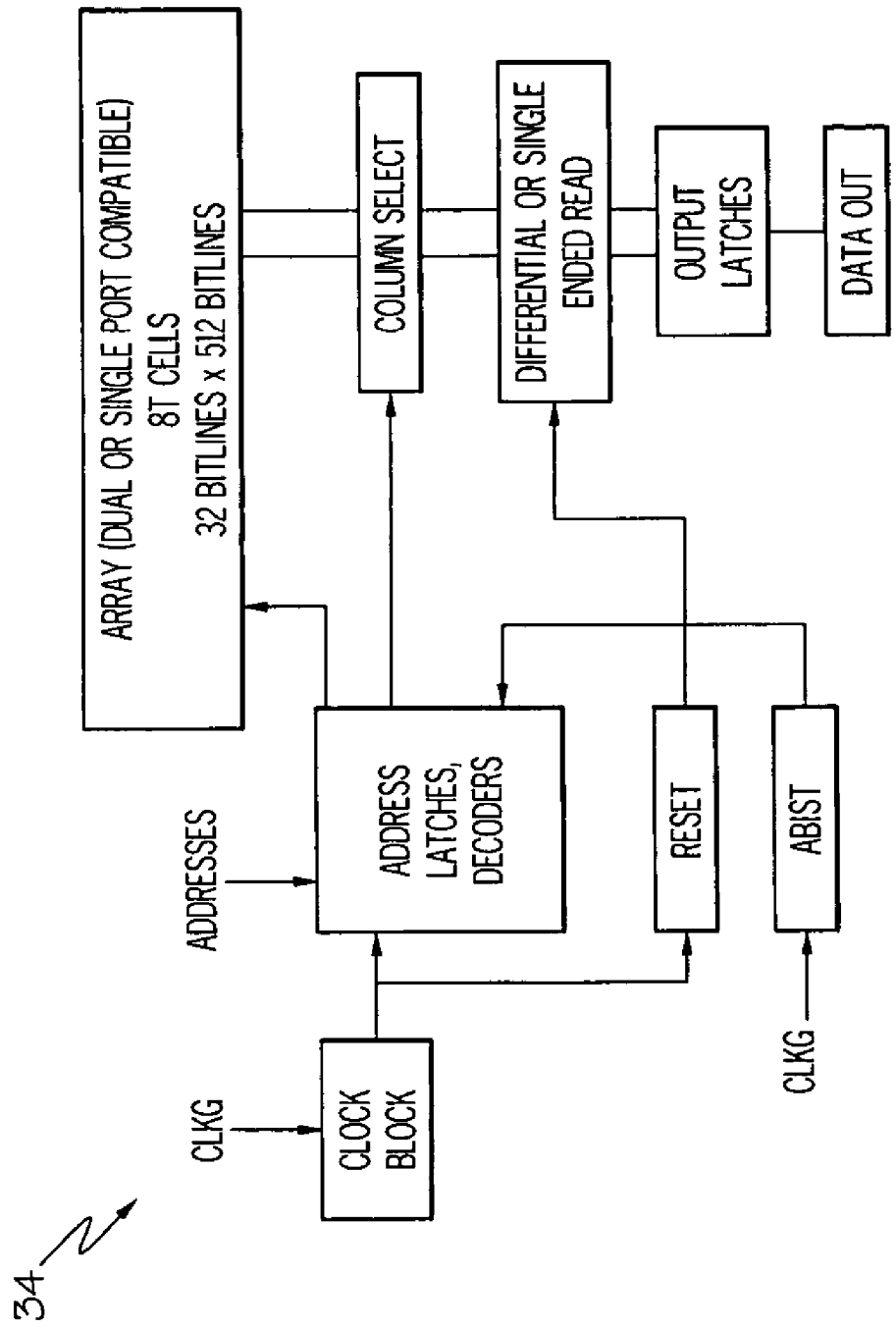
FIG. 4A depicts a SRAM block diagram showing circuits for dual or singled ended SRAMs in accordance with the present invention.

FIG. 4A shows circuit blocks for dual port compatible or single ended read SRAMs such as those shown in FIGS. 3A-C. Specifically, boundary latches are provided to capture word and read/write addresses that are triggered from the clock block. The addresses are then decoded to generate read and write word lines. The data is read/sensed from the cell using a differential sense amplifier for cells sharing the same read/write bit lines. In addition, an ABIST is provided for broad pattern coverage to verify functionality of the SRAM cell.

Figure 4B:
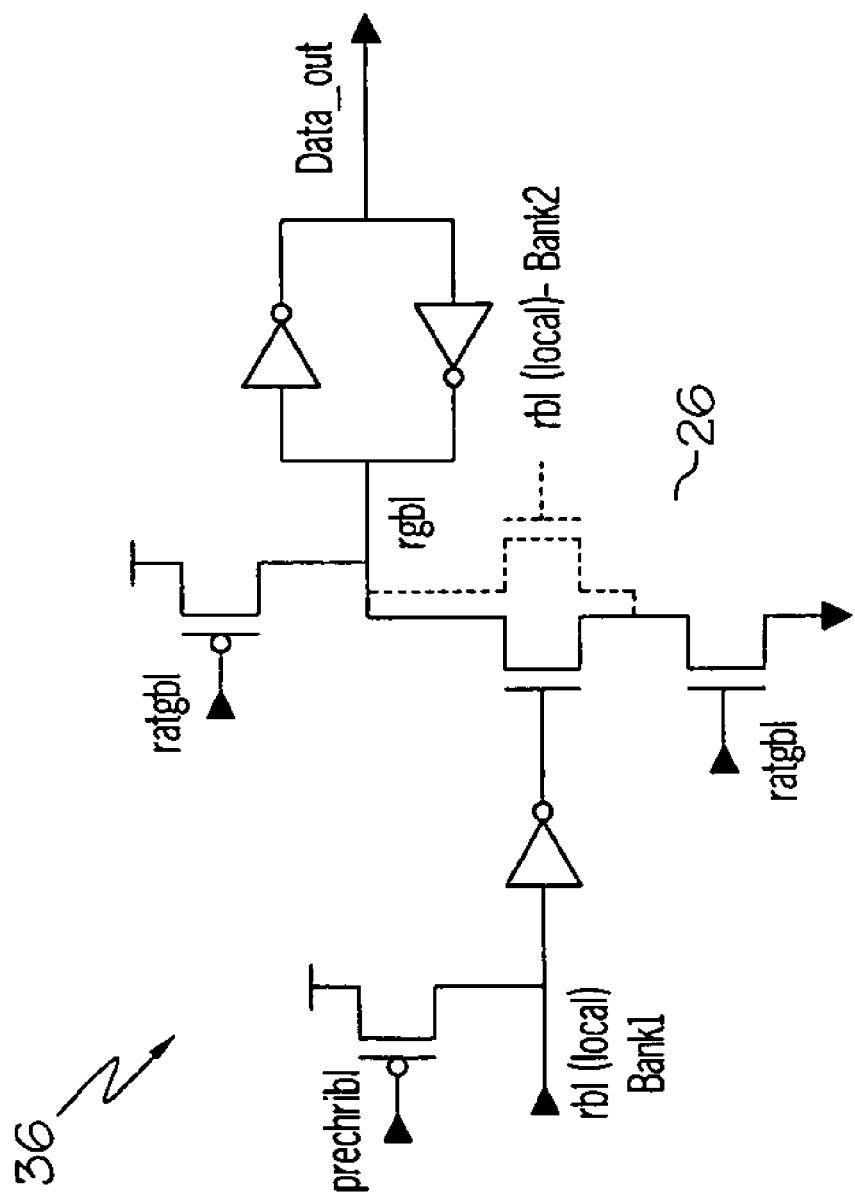
FIG. 4B depicts circuits for single ended SRAMs in accordance with the present invention.

For the single ended read, the circuit scheme is shown in FIG. 4B where the local read bit line (RBL) is inverted to obtain the proper polarity. The two local inverted read bit lines (only one is shown), which are then gated with a selector to generate a global read bit line. At the end, the output is latched. The dynamic nodes are pre-charged through the resets derived from a "clkg" signal.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

We claim:

1. A Static Random Access Memory (SRAM) cell, comprising:
   a write word line;
   a read word line that is decoupled from the write word line;
   a pair of cross-coupled inverters;
   first and second complementary pass transistors coupled to the write word line;

a first pair of stacked transistors having first and second transistors, wherein the first transistor of the first pair of stacked transistors is coupled to a first common read and write bit line and the read word line, and wherein the first common read and write bit line is coupled to the first complementary pass transistor; and a second pair of stacked transistors having first and second transistors, wherein the first transistor of the second pair of stacked transistors is coupled to a second common read and write bit line and the read word line, and wherein the second common read and write bit line is coupled to the second complementary pass transistor; and wherein the second transistor of the first pair of stacked transistors is further coupled to the first complementary pass transistor, and the second transistor of the second pair of stacked transistors is further coupled to the second complementary pass transistor.

2. The SRAM cell of claim 1, further comprising a pair of complementary storage nodes connected to different ones of the pair of cross-coupled inverters.

3. The SRAM cell of claim 1, the SRAM cell being symmetrical.

4. The SRAM cell of claim 1, wherein reading and writing are performed in alternate cycles through each common read and write bit line.

5. The SRAM cell of claim 1, wherein the first pair of stacked transistors and the second pair of stacked transistors provide isolation of the SRAM cell during a read operation.

* * * * *